US011340300B2

(12) United States Patent
Verma et al.

(10) Patent No.: US 11,340,300 B2
(45) Date of Patent: May 24, 2022

(54) BATTERY SERVICE LIFE MANAGEMENT METHOD AND SYSTEM

(71) Applicant: Samsung Electronics Co., Ltd., Suwon-si (KR)

(72) Inventors: Mohan Kumar Singh Verma, Bengaluru (IN); Shashishekara Parampalli Adiga, Bengaluru (IN); Tae Won Song, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 88 days.

(21) Appl. No.: 16/839,235

(22) Filed: Apr. 3, 2020

(65) Prior Publication Data

US 2020/0319256 A1    Oct. 8, 2020

(30) Foreign Application Priority Data

Apr. 5, 2019   (IN) .............................. 201941013827
Mar. 24, 2020 (KR) ........................ 10-2020-0035665

(51) Int. Cl.
  *G01R 31/3842*   (2019.01)
  *G01R 31/3167*   (2006.01)
  (Continued)

(52) U.S. Cl.
  CPC .......... *G01R 31/3842* (2019.01); *B60L 58/13* (2019.02); *G01R 31/3167* (2013.01);
  (Continued)

(58) Field of Classification Search
  CPC ............ G01R 31/3842; G01R 31/3167; G01R 31/3646; G01R 31/392; G01R 31/396;
  (Continued)

(56) References Cited

U.S. PATENT DOCUMENTS 6,300,763 B1 *  10/2001  Kwok ................. G01R 31/367
                                                    324/427
7,807,296 B2 *  10/2010  Vu ...................... H01M 50/463
                                                    429/224
(Continued)

FOREIGN PATENT DOCUMENTS

CN          101682011 A  *  3/2010  .......... H01M 50/449
KR    10-2016-0043369 A     4/2016

OTHER PUBLICATIONS

Smith et al., (Smith), Model-Based Electrochemical Estimation and Constraint Management for Pulse Operation of Lithium Ion Batteries, IEEE Transactions on Control Systems Technology, vol. 18, No. 3, May 2010, pp. 654-662 (Year: 2010).*
(Continued)

*Primary Examiner* — M Baye Diao
(74) *Attorney, Agent, or Firm* — NSIP Law

(57) ABSTRACT

A method and system that enhances a service life of a battery is provided. The method includes values of a set of operational characteristics of a plurality of electrochemically active materials of at least one electrode of the battery. The set of operational characteristics include a voltage, a change in accumulated energy, a change in ohmic resistance, and a change in a rate of change in accumulated energy with respect to a rate of change in ohmic resistance. The values are compared with predefined values of the set of operational characteristics. A rate of depletion and a type of depletion of each of the plurality of electrochemically active materials are determined, and a range of the State of Charge, a range of the voltage, and a range of current to operate the battery for enhanced service life are determined.

16 Claims, 7 Drawing Sheets

(51) Int. Cl.
*G01R 31/36* (2020.01)
*G01R 31/392* (2019.01)
*B60L 58/13* (2019.01)
*H01M 10/42* (2006.01)
*G01R 31/396* (2019.01)

(52) U.S. Cl.
CPC ....... *G01R 31/3646* (2019.01); *G01R 31/392* (2019.01); *G01R 31/396* (2019.01); *H01M 10/425* (2013.01); *H01M 2010/4271* (2013.01)

(58) Field of Classification Search
CPC .......... B60L 58/13; B60L 58/16; B60L 58/12; H01M 10/425; H01M 2010/4271; H01M 10/48; H01M 10/052; Y02T 10/70; Y02E 60/10
USPC ........................................................ 320/132
See application file for complete search history.

(56) References Cited

U.S. PATENT DOCUMENTS

| | | | |
|---|---|---|---|
| 8,680,815 B2 | 3/2014 | Wang et al. | |
| 9,172,254 B2 | 10/2015 | Ganor | |
| 9,213,069 B2* | 12/2015 | Joe | H01M 4/362 |
| 9,759,776 B2 | 9/2017 | Vinit et al. | |
| 10,006,967 B2 | 6/2018 | Ganesan et al. | |
| 2006/0257728 A1* | 11/2006 | Mortensen | H01M 6/08 |
| | | | 429/144 |
| 2011/0025258 A1 | 2/2011 | Kim et al. | |
| 2015/0032361 A1 | 11/2015 | Ahn et al. | |

OTHER PUBLICATIONS

Kandler A. Smith, Electrochemical Control of Lithium-Ion Batteries, Apr. 2010, IEEE Control Systems Magazine, pp. 18-25 (Year: 2010).*

* cited by examiner

BATTERY SERVICE LIFE MANAGEMENT METHOD AND SYSTEM

CROSS-REFERENCE TO RELATED APPLICATIONS

This application claims the benefit under 35 USC § 119(a) of Indian Patent Application No. 201941013827, filed on Apr. 5, 2019 in the Indian Patent Office, and Korean Patent Application No. 10-2020-0035665, filed on Mar. 24, 2020 in the Korean Intellectual Property Office, the entire disclosures of which are incorporated herein by reference for all purposes.

BACKGROUND

1. Field

The present disclosure relates to a battery service life management method and system.

2. Description of Related Art

Batteries, such as lithium-ion batteries, may provide high power and high energy densities in portable applications such as, for example, mobile devices, computing devices, and propulsion systems for vehicles. In view of advancements in battery technology, the performance of batteries may be improved by providing the batteries with blended electrodes which have multiple electrochemically active materials, such as Lithium Manganese Oxide (LMO), Lithium Nickel Cobalt Aluminum Oxide (NCA), and Lithium Nickel Manganese Cobalt Oxide (NCM).

In view of the presence of multiple electrochemically active materials, the degradation of the blended electrode over time is a complex process which may be caused by various degradation mechanisms. Currently, various systems may monitor such degradation mechanisms for the blended electrode by performing off-line calculations to determine a type of degradation and a rate of degradation. However, such systems may be substantially expensive, and fail to predict optimal charging and/or discharging protocols for the battery based on the degradation of the blended electrode.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In a general aspect, a method includes detecting, by a User Equipment (UE), values of a set of operational characteristics of a plurality of electrochemically active materials of at least one electrode of a battery, comparing, by the UE, the detected values with predefined values of the set of operational characteristics of each of the plurality of electrochemically active materials, determining, by the UE, a rate of depletion of each of the plurality of electrochemically active materials, and a type of depletion of each of the plurality of electrochemically active materials during an operation of the battery, based on the comparing, wherein the rate of depletion is determined based on at least one of a State-of-Charge (SOC) of the battery, and a voltage of the battery, and determining, by the UE, at least one of a range of the SOC, a range of the voltage, and a range of current to operate the battery, based on the determined rate of depletion and the determined type of depletion of each of the plurality of electrochemically active materials.

The set of operational characteristics comprises at least one of a voltage, a change in accumulated energy, a change in ohmic resistance, and a change in a rate of change in accumulated energy with respect to a rate of change in ohmic resistance.

The method may further include generating a notification to operate the battery within the determined range of the SOC, the determined range of the current, or the determined range of the voltage based on at least one of the determined range of the SOC, the determined range of the current, and the determined range of the voltage, wherein the notification is at least one of a visual notification and an audio notification.

The method may include generating a performance report, receiving, in response to the generated performance report, an instruction to select at least one of the range of the SOC and the range of the voltage; and operating the battery in one of the selected range of the SOC and the selected range of the voltage, based on the received instruction, wherein the performance report comprises at least one of: (a) the rate of depletion of each of the plurality of electrochemically active materials of the at least one electrode; (b) the type of depletion of each of the plurality of electrochemically active materials of the at least one electrode; and (c) at least one of the range of the SOC, the range of the current, and the range of the charging voltage of the battery.

The type of depletion may include at least one of an Ohmic Resistance Increase (ORI) depletion, a Loss of Active Material (LAM) depletion, and a Loss of Lithium Inventory (LLI) depletion.

The method may include determining the type of depletion of each of the plurality of electrochemically active materials to be the ORI depletion, when a value of a change in ohmic resistance increases with respect to a first predefined value; and determining the type of depletion of each of the plurality of electrochemically active materials to be the LLI depletion, when the value of the change in ohmic resistance increases with respect to a second predefined value.

The method may include determining the type of depletion of each of the plurality of electrochemically active materials to be one of the LAM and the LLI, when at least one peak corresponding to each of the plurality of electrochemically active materials in a first graph shifts downwardly with respect to at least one predefined peak corresponding to each of the plurality of electrochemically active materials in a second graph, wherein the first graph depicts the detected values of the set of operational characteristics, and the second graph depicts the predefined values of the set of operational characteristics.

The plurality of electrochemically active materials may include a Lithium Manganese Oxide (LMO), Lithium Nickel Cobalt Aluminum Oxide (NCA), and Lithium Nickel Manganese Cobalt Oxide (NCM).

In a general aspect, a system includes a controller communicatively coupled with a battery, wherein the controller is configured to: detect values of a set of operational characteristics of a plurality of electrochemically active materials of at least one electrode of the battery; compare the detected values with predefined values of the set of operational characteristics of each of the plurality of electrochemically active materials; determine a rate of depletion of each of the plurality of electrochemically active materials, and a type of depletion of each of the plurality of electrochemically active materials during an operation of the battery, based on the comparing, wherein the rate of depletion is determined based on at least one of a State-of-Charge (SOC) of the battery, and a voltage of the battery; and determine at least one of a range of the SOC, a range of the voltage, and a range of current to operate the battery, based on the determined rate of depletion and the determined type of depletion of each of the plurality of electrochemically active materials.

The set of operational characteristics may include at least one of a voltage, a change in accumulated energy, a change in ohmic resistance, and a change in a rate of change in accumulated energy with respect to a rate of change in ohmic resistance.

The controller may be further configured to generate a notification to operate the battery within the determined range of the SOC, the determined range of the current, or the determined range of the voltage based on at least one of the determined range of SOC, the determined range of the current, and the determined range of the voltage, wherein the notification is at least one of a visual notification and an audio notification.

The controller may be further configured to: generate a performance report, receive, in response to the generated performance report, an instruction to select at least one of the range of the SOC and the range of the voltage; and operate the battery in one of the selected range of the SOC and the selected range of the voltage, based on the received instruction, wherein the performance report comprises at least one of: (a) the rate of depletion of each of the plurality of electrochemically active materials of the at least one electrode; (b) the type of depletion of each of the plurality of electrochemically active materials of the at least one electrode; and (c) at least one of the range of the SOC, the range of the current, and the range of the charging voltage of the battery.

The type of depletion may include at least one of Ohmic Resistance Increase (ORI) depletion, Loss of Active Material (LAM) depletion, and a Loss of Lithium Inventory (LLI) depletion.

The controller may be further configured to determine the type of depletion of each of the plurality of electrochemically active materials to be the ORI depletion, when a value of a change in ohmic resistance increases with respect to a first predefined value; and determine the type of depletion of each of the plurality of electrochemically active materials to be the LLI depletion, when the value of the change in ohmic resistance increases with respect to a second predefined value.

The controller may be further configured to determine the type of depletion of each of the plurality of electrochemically active materials to be one of the LAM and the LLI, when at least one peak corresponding to at least one the plurality of electrochemically active materials in a first graph shifts downwardly with respect to at least one predefined peak corresponding to at least one of the plurality of electrochemically active materials in a second graph, wherein the first graph depicts the detected values of the set of operational characteristics, and the second graph depicts the predefined values of the set of operational characteristics.

The plurality of electrochemically active materials may include a Lithium Manganese Oxide (LMO), Lithium Nickel Cobalt Aluminium Oxide (NCA), and Lithium Nickel Manganese Cobalt Oxide (NCM).

Other features and aspects will be apparent from the following detailed description, the drawings, and the claims.

Figure 1A:
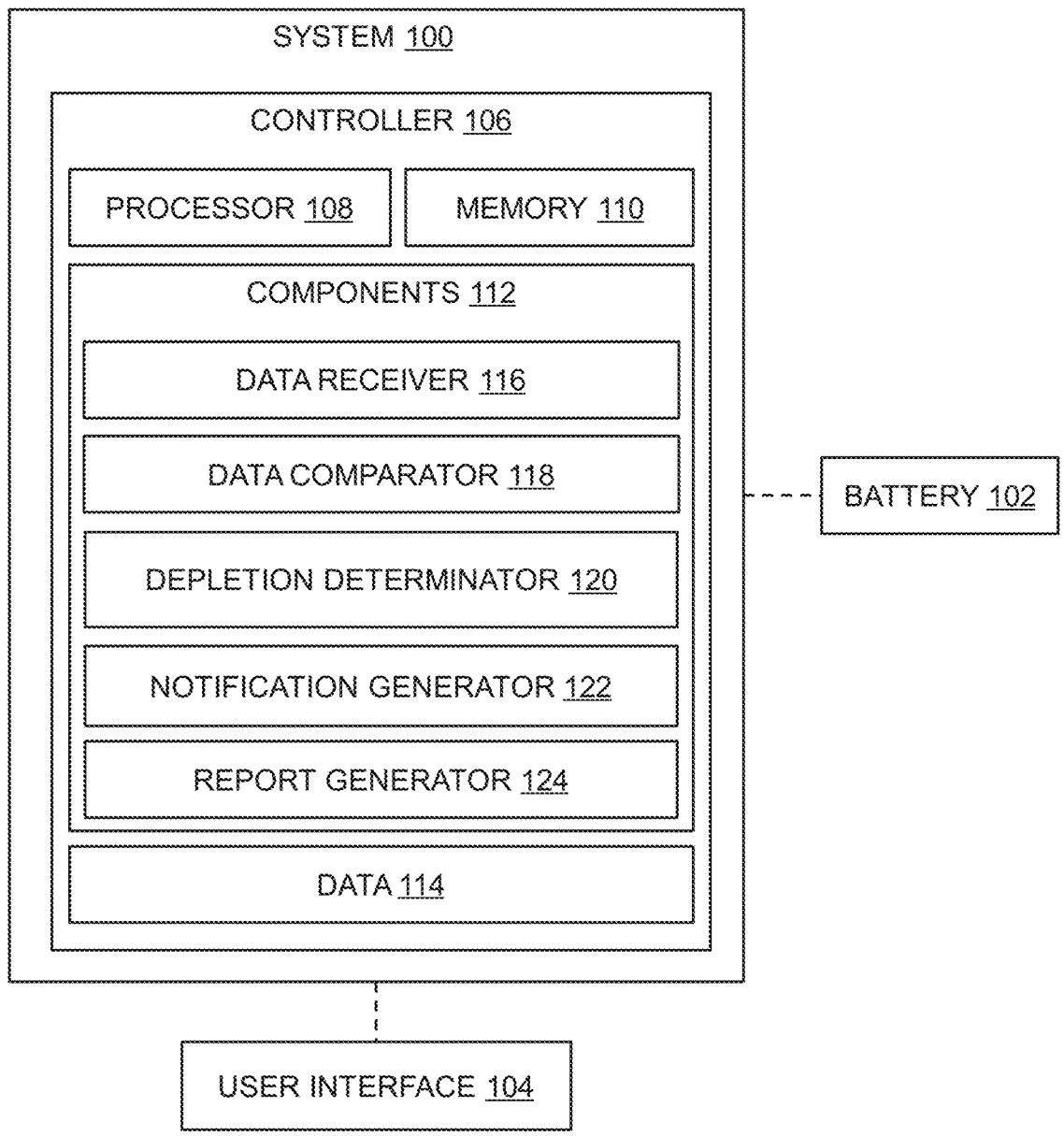
FIG. 1A illustrates an example of a battery life enhancing system in communication with a battery. In accordance with one or more embodiments.

Throughout the drawings and the detailed description, unless otherwise described or provided, the same drawing reference numerals will be understood to refer to the same elements, features, and structures. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known, after an understanding of the disclosure of the application, may be omitted for increased clarity and conciseness.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Unless otherwise defined, all terms, including technical and scientific terms, used herein have the same meaning as commonly understood by one of ordinary skill in the art to which this disclosure pertains after an understanding of the disclosure of this application. Terms, such as those defined in commonly used dictionaries, are to be interpreted as having a meaning that is consistent with their meaning in the context of the relevant art and the disclosure of the present application, and are not to be interpreted in an idealized or overly formal sense unless expressly so defined herein.

When describing the examples with reference to the accompanying drawings, like reference numerals refer to like constituent elements and a repeated description related thereto will be omitted. In the description of examples, detailed description of well-known related structures or functions will be omitted when it is deemed that such description will cause ambiguous interpretation of the present disclosure.

In addition, terms such as first, second, A, B, (a), (b), and the like may be used herein to describe components. Each of these terminologies is not used to define an essence, order or sequence of a corresponding component but used merely to distinguish the corresponding component from other component(s).

The same name may be used to describe an element included in the examples described above and an element having a common function. Unless otherwise mentioned, the descriptions on the examples may be applicable to the following examples and thus, duplicated descriptions will be omitted for conciseness.

FIG. 1A illustrates a schematic view of a system 100 in communication with a battery 102 that enhances a service life of the battery 102. The battery 102 may be embodied, as a non-limiting example, as a lithium-ion battery that is implemented as a power source in various applications. The battery 102 may be implemented in, for example, portable devices such as smart phones, laptops, digital cameras, video cameras, tablets, computers, and electric tools. Additionally, the battery 102 may also be implemented in vehicles such as electric bikes, motor cycles, electric vehicles, hybrid vehicles, electric ships, and electric airplanes.

The battery 102 may include, but is not limited to, at least one anode and at least one cathode. In an example, the at least one anode may be embodied as a blended electrode having a plurality of electrochemically active materials. The plurality of electrochemically active materials may include, but is not limited to, a Lithium Manganese Oxide (LMO), Lithium Nickel Cobalt Aluminum Oxide (NCA), and Lithium Nickel Manganese Cobalt Oxide (NCM). In another example, the at least one cathode may be embodied as the blended electrode which has the plurality of electrochemically active materials. In yet another example, each of the at least one cathode and the at least one electrode may be embodied as the blended electrode having the plurality of electrochemically active materials.

Figure 1B:
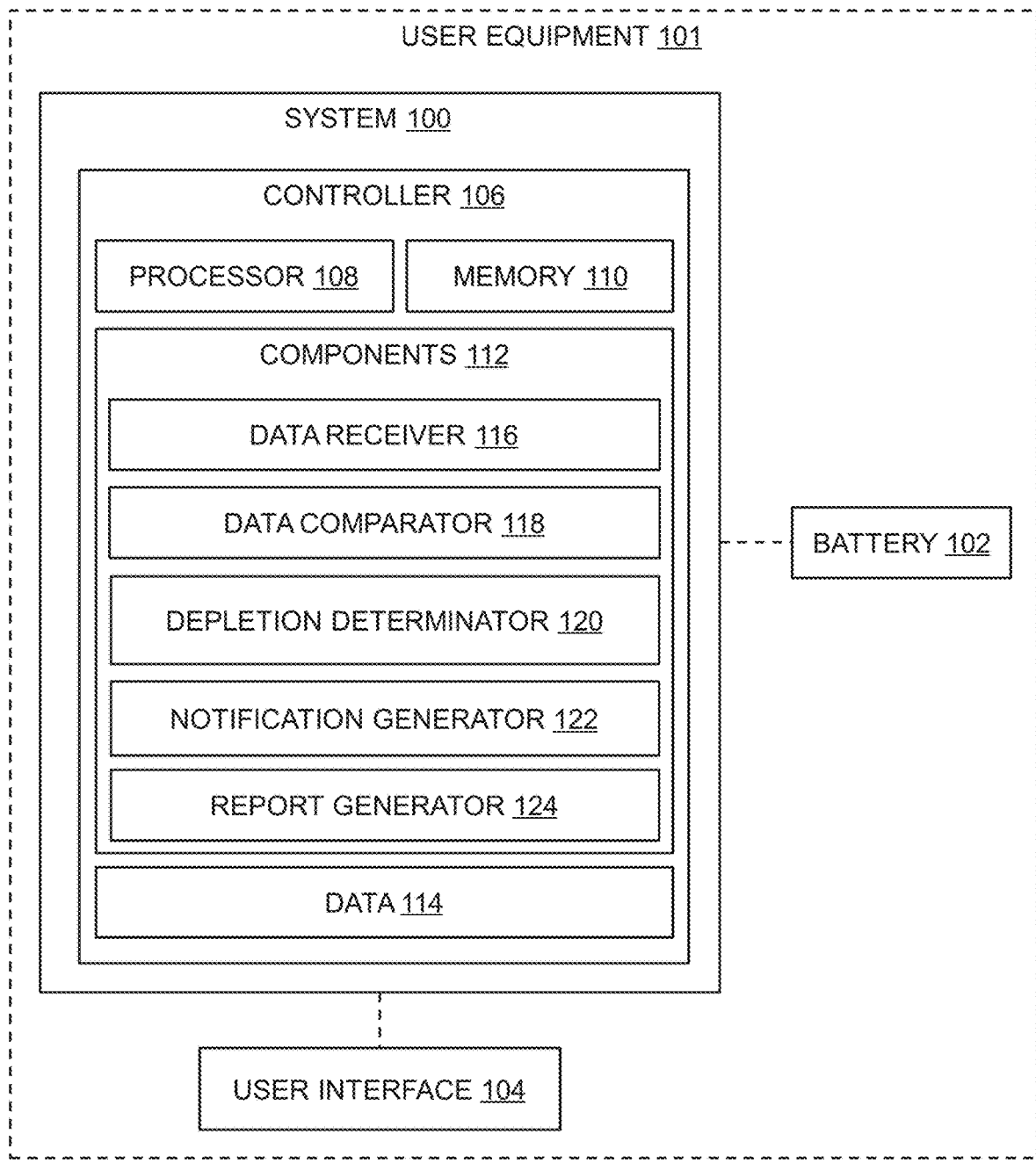
FIG. 1B illustrates an example of a User Equipment (UE) or electronic device which includes a battery life enhancing system in communication with a battery, in accordance with one or more embodiments.

In an example, the system 100 may be implemented to enhance the service life of the battery 102. In one example, the battery 102 may be implemented as a power source in an electric vehicle (EV). In such an example, the system 100 may be implemented or embodied in a Battery Management System (BMS) of the battery 102 of the electric vehicle. In another example, the battery 102 may be implemented or embodied as a power source in various User Equipment (UE) and/or electronic devices including, but not limited to, a smart phone, a tablet, a digital camera, a camcorder, and a PDA. In such an example, the system 100 may be implemented or embodied in an electronic device that enhances the service life of the battery 102. Accordingly, as shown in FIG. 1B, one or more components of the system 100 may be implemented as one or more components of a UE and or an electronic device 101, without departing from the scope of the present disclosure.

The system 100 may monitor the performance of the battery 102, and determine a range of a State-of-Charge (SOC), a range of a voltage, and a range of a current of the battery 102 that is needed to operate the battery 102 in order to enhance the service life of the battery. In an example, the system 100 may monitor a set of operational characteristics of the plurality of electrochemically active materials of the blended electrode of the battery 102, in real-time or during an operation of the battery 102. Further, the system 100 may monitor degradation of the plurality of electrochemically active materials based on the set of operational characteristics. Subsequently, the system 100 may provide at least one notification for a user to operate the battery 102 within the range of the SOC, the range of the voltage, and the range of the current of the battery 102. In an example, the system 100 may be in communication with a user interface 104 to provide the at least one notification to the user. In an example, the user interface 104 may be a display that receives an input from a user, or that provides an output. In an example, the input/output interface 104 may function as an input device, and may receive an input from a user through an input method, for example, a keyboard, a mouse, a touch input, a voice input, and an image input. Thus, the user interface 104 may include, as non-limiting examples, a keyboard, a mouse, a touchscreen, a microphone, and other devices that may detect an input from a user and transmit the detected input to the processor 108.

Hereinafter, a detailed operation of the system 100 will be described in detail with reference to FIGS. 1A and 1B.

The system 100 may include a controller 106 that is communicatively coupled with the battery 102. In an example, the controller 106 may include one or more processors 108, one of more memories 110, components 112, and data 114. As indicated herein, "processor" may mean one or more processors, and "memory" may mean one or more memories. The components 112 and the memory 110 may be coupled to the processor 108. The processor 108 may be a single processor or a plurality of processors, all of which could include multiple computing elements. The processor 108 may be implemented as one or more microprocessors, microcomputers, microcontrollers, digital signal processors, central processing units, state machines, logic circuitries, and/or any devices that manipulate signals based on operational instructions. Among other capabilities, the processor 108 may be configured to fetch and execute computer-readable instructions and data stored in the memory 110. Herein, it is noted that use of the term 'may' with respect to an example or embodiment, e.g., as to what an example or embodiment may include or implement, means that at least one example or embodiment exists where such a feature is included or implemented while all examples and embodiments are not limited thereto.

The memory 120 may include at least one of volatile memory or nonvolatile memory. The nonvolatile memory may include read only memory (ROM), programmable ROM (PROM), electrically programmable ROM (EPROM), electrically erasable and programmable ROM (EEPROM), flash memory, phase-change RAM (PRAM), magnetic RAM (MRAM), resistive RAM (RRAM), ferroelectric RAM (FRAM), and the like. The volatile memory may include dynamic RAM (DRAM), static RAM (SRAM), synchronous DRAM (SDRAM), phase-change RAM (PRAM), magnetic RAM (MRAM), resistive RAM (RRAM), ferroelectric RAM (FeRAM), and the like. Furthermore, the memory 120 may include at least one of hard disk drives (HDDs), solid state drive (SSDs), compact flash (CF) cards, secure digital (SD) cards, micro secure digital (Micro-SD) cards, mini secure digital (Mini-SD) cards, extreme digital (xD) cards, or Memory Sticks.

The components 112, may include, as non-limiting examples, routines, programs, objects, components, data structures, etc., which perform particular tasks or implement data types. The components 112 may also be implemented as, for example, signal processor(s), state machine(s), logic circuitries, and/or any other device or component that manipulate signals based on operational instructions.

Further, the components 112 may be implemented in hardware, instructions executed by a processor, or by a combination thereof. The processor may comprise a computer, a processor, such as the processor 108, a state machine, a logic array or any other suitable devices capable of processing instructions. The processor may be a general-purpose processor which executes instructions to cause the general-purpose processor to perform the required tasks or, the processor may be dedicated to perform the required functions. In another aspect of the examples, the modules components 112 may be machine-readable instructions (software) which, when executed by a processor, perform any of the described functionalities.

In an implementation, the components 112 may include a data receiver 116, a data comparator 118, a depletion determinator 120, and a notification generator 122, and a report generator 124. The data receiver 116, the data comparator 118, the depletion determinator 120, the notification generator 122, and the report generator 124 may be in communication with each other. The data 114 may be, as a non-limiting example, a repository that stores data processed, received, and generated by one or more of the components 112. As mentioned earlier, one or more aforementioned components, such as the components 112 of the system 100 may be implemented as one or more components of the UE or the electronic device 101, such as, but not limited to, a smart phone, a tablet, a digital camera, a camcorder, and a PDA.

The controller 106 may be configured to detect, in real-time, or during the operation of the battery 102, values of a set of operational characteristics of the plurality of electrochemically active materials of at least one electrode of the battery 102. As explained earlier, the plurality of electrochemically active materials may include, but is not limited to, the Lithium Manganese Oxide (LMO), the Lithium Nickel Cobalt Aluminum Oxide (NCA), and the Lithium Nickel Manganese Cobalt Oxide (NCM). In an example, the plurality of electrochemically active materials may interchangeably be referred to as the active materials, without departing from the scope of the present disclosure.

For the sake of simplicity and better understanding, the present disclosure is explained with respect to only one electrode of the battery 102 which has the active materials. However, the examples are also applicable to a plurality of electrodes of the battery 102 having the active materials. In an example, the electrode may interchangeably be referred to as blended electrode, without departing from the scope of the examples.

In an example, the data receiver 116 may be configured to detect values of the set of operational characteristics of the active materials of the blended electrode. The set of operational characteristics may be indicative of at least one of, but not limited to, a voltage (V), a change in accumulated energy (dQ), a change in ohmic resistance (dR), and a change in a rate of change in accumulated energy with respect to a rate of change in ohmic resistance (dQ/dR). Upon detecting the values of the set of operational characteristics, the controller 106 may be configured to determine a real-time charge-capacity-derivative, i.e., dQ/dR vs. R distribution graph of the blended electrode of the battery 102, which will be explained in detail with regard to the description of FIG. 4. In an example, the real-time charge-capacity-derivative, i.e., dQ/dR vs. R distribution graph may interchangeably be referred to as a first graph, without departing from the scope of the examples. The first graph may be associated with the detected values of the set of operational characteristics of each of the active materials of the blended electrode.

Further, the controller 106 may be configured to compare the values with predefined values of the set of operational characteristics of each of the active materials. In an example, the controller 106 may store the predefined values corresponding to each of the active materials in a form of a predefined dQ/dR distribution graph, interchangeably referred to as a second graph. The second graph may be associated with the predefined values of the set of operational characteristics of each of the active materials. For instance, the controller 106 may store the predefined values of the set of operational characteristics of each of the LMO material, the NCA material, and the NCM material in a form of predefined dQ/dR distribution curves of the second graph, which will be explained in detail in description of the FIG. 2.

In an example, the data comparator 118 may be configured to compare the values of a set of operational characteristics of the plurality of electrochemically active materials of at least one electrode with the predefined values of the set of operational characteristics of each of the plurality of electrochemically active materials. The data comparator 118 may compare the second graph with the first graph of the blended electrode of the battery 102. In an example, the data comparator 118 may compare the predefined dQ/dR distribution curves of each of the active materials with the first graph of the blended electrode of the battery 102. In an example, the data comparator 118 may superimpose each of the predefined dQ/dR distribution curves on the first graph of the blended electrode of the battery 102, which will be explained in detail in description of FIG. 4.

Furthermore, the controller 106 may be configured to determine a rate of depletion of the active materials and a type of depletion of each of the active materials during an operation of the battery 102, based on the comparison. In an example, the depletion determinator 120 may be configured to determine the rate of depletion and the type of depletion of each of the active materials of the blended electrode. In an example, the type of depletion may include at least one of an Ohmic Resistance Increase (ORI) depletion, a Loss of Active Material (LAM) depletion, and a Loss of Lithium Inventory (LLI) depletion.

In an example, the ORI depletion may result from various sources of battery degradation, and causes a shift in a voltage potential of the battery 102, thereby reducing energy efficiency of the battery 102. The LAM depletion may be related to structural and mechanical degradation of the blended electrode of the battery 102. In an example, the LAM depletion may occur due to oxidation of the electrolyte, electrode decomposition, intercalation gradient strains in active particles, and crystal structure disorder. Further, the LLI depletion may result from parasitic reactions originated in an electrode/electrolyte interface, and mainly attributed to continuous growth of a solid electrolyte interface (SEI) layer. The LLI depletion may occur due to loss of usable lithium ions, caused by the parasitic reactions that are originated in the electrode/electrolyte interface. In an example, the LLI depletion may also occur due to electrolyte decomposition, lithium plating, and formation of Li-ion grains.

In one example, the controller 106 may determine the type of depletion of each of the active materials as the ORI depletion, when the value of the change in ohmic resistance increases with respect to a first predefined value of corresponding active material. In such an example, the first predefined value may be a predefined value of the change in ohmic resistance. Further, in such an example, if the controller 106 determines at least one peak corresponding to at least one of the plurality of active materials in the first graph shifts laterally with respect to at least one predefined peak corresponding to at least one of the plurality of electrochemically active materials in the second graph, the controller 106 may determine the type of depletion as the ORI depletion.

In another example, the controller 106 may be configured to determine the type of depletion of each of the active material as the LLI depletion, when the value of the change in ohmic resistance increases with respect to a second predefined value of corresponding active material. In such an example, the second predefined value may be a predefined value of the change in ohmic resistance. In such an example, if the controller 106 determines at least one peak corresponding to at least one of the active materials in the first graph shifts laterally with respect to at least one predefined peak corresponding to at least one of the active materials in the second graph, the controller 106 may determine the type of depletion as the LLI depletion.

In yet another example, the controller 106 may be configured to determine the type of depletion of each of the active materials as one of the LAM and the LLI, when at least one peak corresponding to each of the active materials in the first graph shifts downwardly with respect to at least one predefined peak corresponding to each of the active materials in the second graph. As explained earlier, the first graph may be associated with the predefined values of the set of operational characteristics of each of the plurality of the electrochemically active materials. Similarly, the second graph may be associated with the detected values of the set of operational characteristics of each of the plurality of the electrochemically active materials. Further, the rate of depletion may be determined with respect to a State-of-Charge (SOC) and a voltage of the battery 102. As explained earlier, the controller 106 may be configured to determine the range of the SOC, the range of the voltage, and the range of the current to operate the battery 102 for enhanced service life, based on the rate of depletion and the type of depletion of each of the plurality of electrochemically active materials.

In an example, the controller 106 may be configured to generate a notification for a user to operate the battery 102 within the range of the SOC, the range of the current, and the range of the voltage, based on at least one of the range of the SOC, the range of the current, and the range of the voltage. In an example, the notification generation module 122 may generate the notification for the user to operate the battery 102 within the range of the SOC and within the range of the voltage, based on at least one of the range of the SOC, the range of the current, and the range of the voltage. The notification may be at least one of a visual notification and an audio notification.

For instance, if the battery 102 is employed in the electric vehicle (EV), the controller 106 may generate the notification for the user to operate the battery 102 of the electric vehicle within the range of the SOC, the range of the current, and the range of the voltage. In such an instance, based on the range of the SOC, the range of the current, and the range of the voltage, the controller 106 may generate the notification indicating a distance to be travelled by the electric vehicle (EV) in a current itinerary. Further, the controller 106 may generate the notification indicating prediction of battery usage over a period of time. Additionally, the controller 106 may generate the notification indicating charging and discharging patterns to be followed by the user for enhancing the service life of the battery 102.

In an example, the controller 106 may be configured to generate a performance report. In one example, the performance report may include the rate of depletion of each of the active materials of the blended electrode. In another example, the performance report may include the type of depletion of each of the active materials of the blended electrode. In yet another example, the performance report may include at least one suggestion indicative of at least one of the range of the SOC and the range of the voltage for charging and consumption of the battery 102.

In an example, the controller 106 may be configured to receive an instruction that indicates a selection of at least one of the range of the SOC and the range of the voltage, in response to the generation of the performance report. Further, the controller 106 may be configured to operate the battery 102 in the selected range of the SOC or the selected range of the voltage, based on the received instruction.

Figure 2:
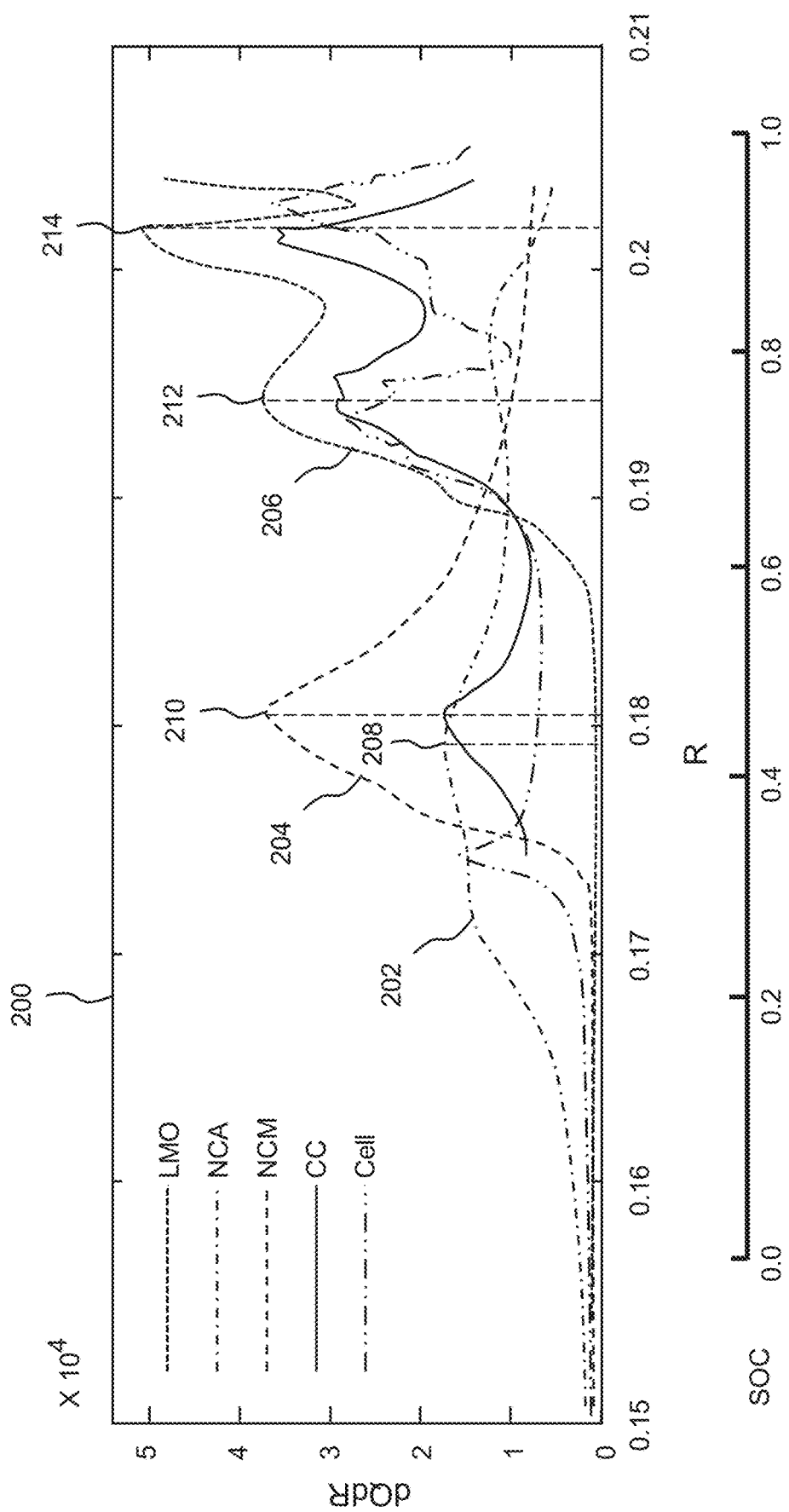
FIG. 2 illustrates a graphical plot depicting an example of a predefined charge-capacity-derivative, i.e., dQ/dR vs. R distribution for each of a plurality of electrochemically active materials, in accordance with one or more embodiments.

FIG. 2 illustrates an example of a graphical plot depicting a predefined charge-capacity-derivative, i.e., dQ/dR vs. R distribution for each of a plurality of electrochemically active materials, in accordance with one or more embodiments.

Referring to FIG. 2, the second graph 200 depicts values of the predefined charge-capacity-derivative, i.e., dQ/dR plotted on a Y-axis of the graph, and values of the ohmic resistance (R) plotted on an X-axis of the graph. In an example, the second graph 200 may interchangeably be referred to as the predefined distribution graph 200, without departing from the scope of the examples. In an example, the predefined distribution graph 200 depicts a predefined differential curve plotted based on the predefined values of the set of operational characteristics of each of the active materials.

In an example, the predefined distribution graph 200 may include a first differential curve 202 that is plotted based on the predefined values of the set of operational characteristics of the NCA material. Similarly, the predefined distribution graph 200 may include a second differential curve 204 that is plotted based on the predefined values of the set of operational characteristics of the NCM material. Further, the predefined distribution graph 200 may include a third differential curve 206 that is plotted based on the predefined values of the set of operational characteristics of the LMO material.

Each of the first differential curve 202, the second differential curve 204, and the third differential curve 206 may depict at least one preferred peak corresponding to each of the active materials i.e., the NCA material, the NCM material, and the LMO material. In an example, the at least one preferred peak may interchangeably be referred to as the preferred peak. The preferred peaks in the differential curves may indicate phase equilibria of the active materials of the blended electrode. For example, the first differential curve 202 associated with the NCA material may include a first preferred peak 208 located at a value of the ohmic resistance (R), i.e., approximately at 0.178 Milliohm (mΩ) resistance. Further, the second differential curve 204 associated with the NCM material may include a second preferred peak 210 located at a value of the ohmic resistance (R), i.e., approximately 0.181 mΩ. Furthermore, the third differential curve 206 associated with the LMO material may include a third preferred peak 212 and a fourth preferred peak 214 located at values of the ohmic resistance (R), i.e., approximately 0.195 mΩ and approximately at 0.2 mΩ, respectively.

Figure 3:
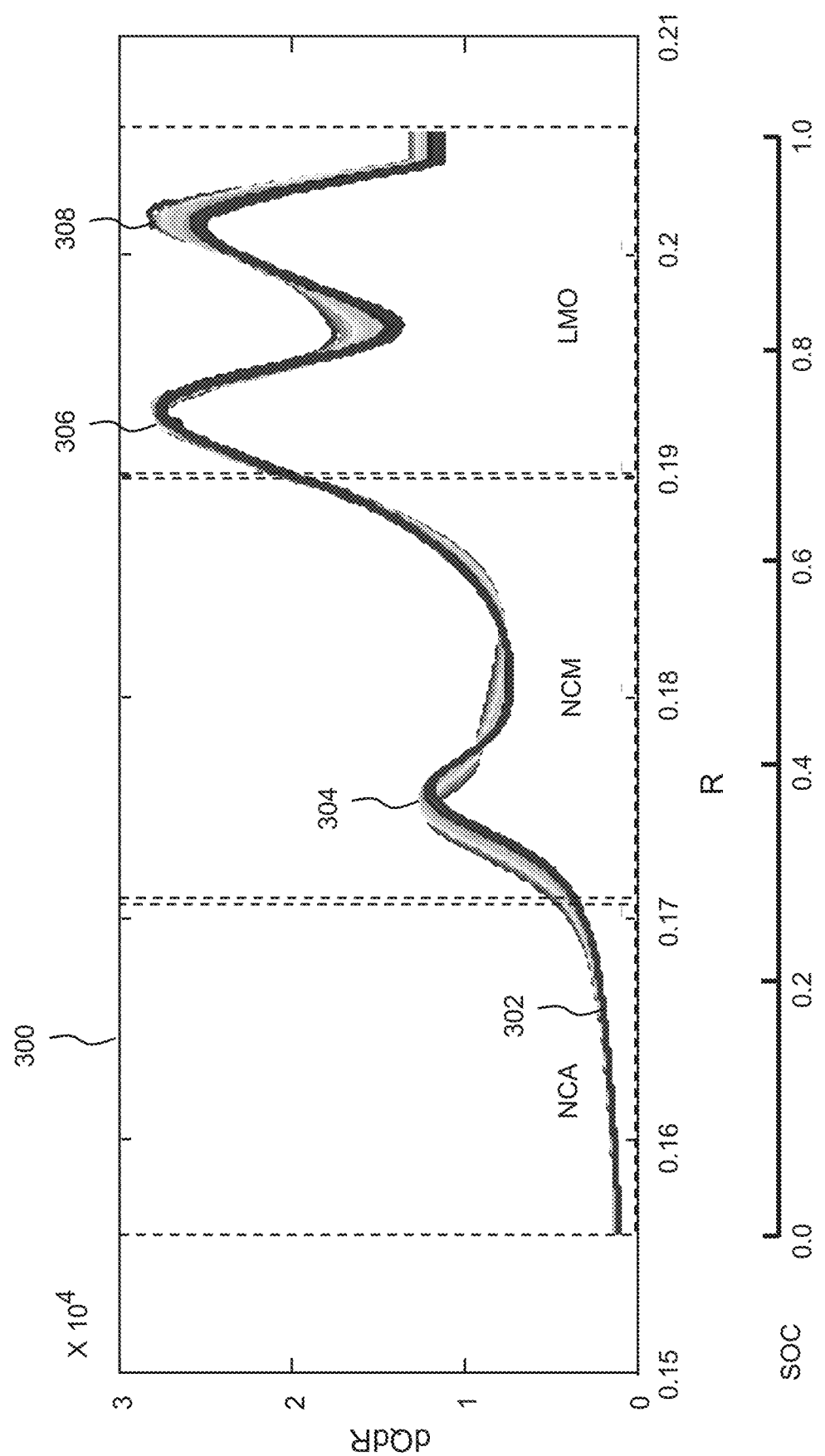
FIG. 3 illustrates a graphical plot depicting an example of a real-time charge-capacity-derivative, i.e., dQ/dR vs. R distribution of a battery which has a plurality of electrochemically active materials, in accordance with one or more embodiments.

FIG. 3 illustrates an example of a graphical plot depicting a real-time charge-capacity-derivative, i.e., dQ/dR vs. R distribution of the battery 102 having the plurality of electrochemically active materials, in accordance with one or more embodiments.

Referring to FIG. 3, the first graph 300 depicts values of the real-time charge-capacity-derivative, i.e., dQ/dR plotted on a Y-axis of the graph, and values of the ohmic resistance (R) plotted on an X-axis of the graph. In an example, the first graph 300 may interchangeably be referred to as the real-time distribution graph 300, without departing from the scope of the examples. The real-time distribution graph 300 depicts a differential curve 302 that is plotted based on the real-time values of the set of operational characteristics of each of the active materials of the blended electrode.

The differential curve 302 of the real-time distribution graph depicts at least one peak corresponding to each of the active materials of the blended electrode. In an example, the at least one peak may be interchangeably referred to as the peaks, without departing from the scope of the examples. The peaks may individually be referred to as a peak, without departing from the scope of examples. As explained earlier, the controller 106 may determine the real-time distribution graph 300 based on the values of the set of operational characteristics of the active materials, which may be determined in real-time or during the operation of the battery 102.

Referring to FIG. 3, the real-time distribution graph 300 depicts different active regions associated with the active materials of the blended electrode. In an example, the real-time distribution graph 300 may depict that the NCA material is active within a range of the ohmic resistance (R), i.e., approximately 0.155 mΩ-0.17 mΩ, during the operation of the battery 102. Further, the real-time distribution graph 300 may depict that the NCM material is active within a range of the ohmic resistance, i.e., approximately 0.17 mΩ-0.19 mΩ. Furthermore, the real-time distribution graph may depict that the LMO material is active within a range of the ohmic resistance (R), i.e., approximately 0.19 mΩ-0.25 mΩ.

Further, the differential curve 302 of the real-time distribution graph 300 may depict a first peak 304, a second peak 306, and a third peak 308. The controller 106 may compare the differential curve 302 of the real-time distribution graph 300 with the differential curves, i.e., the first differential curve 202, the second differential curve 204, and the third differential curve 206 of the predefined distribution graph 200 illustrated in FIG. 2. Based on the comparison, the controller 106 may determine that the first peak 304 of the differential curve 302 is associated with the NCM material of the blended electrode. Similarly, the controller 106 may determine that the second peak 306 and the third peak 308 of the differential curve 302 are associated with the LMO material of the blended electrode.

Figure 4:
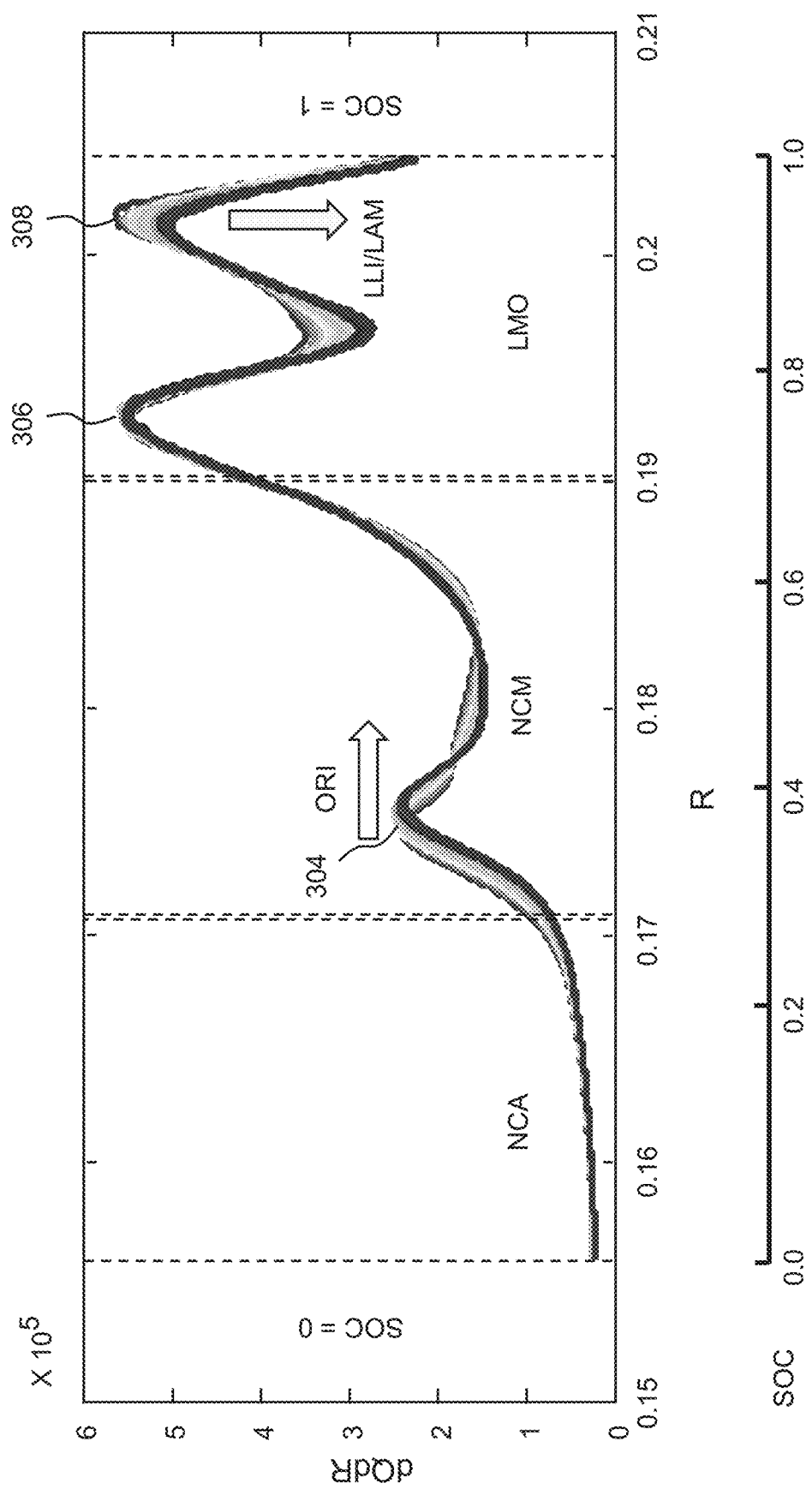
FIG. 4 illustrates a graph depicting an example of a type of depletion and a rate of depletion of each of a plurality of electrochemically active materials during an operation of the battery, in accordance with one or more embodiments.

FIG. 4 illustrates an example of a graphical plot depicting a type of depletion and a rate of depletion of each of the plurality of electrochemically active materials during an operation of the battery 102, in accordance with one or more embodiments.

Upon comparing the predefined differential curves 202 with the differential curve 302 of the real-time distribution graph 300, the controller 106 may determine deviations in the peaks, i.e., deviations in the first peak 304, the second peak 306, and the third peak 308, with respect to the preferred peaks, i.e., the first preferred peak 208, the second preferred peak 210, the third preferred peak 212, and the fourth preferred peak 214, associated with each of the active materials. Based on the deviations, the controller 106 may determine the type of depletion and the rate of depletion of each of the active materials during the operation of the battery 102.

Referring to FIG. 4, for instance, the controller 106 may determine a lateral shift in the first peak 304 associated with the NCM material of the blended electrode within the active region of the NCM material, during the operation of the battery 102. In particular, the controller 106 may determine the lateral shift in the first peak 304 of the differential curve 302 of the real-time distribution graph 300, based on the comparison with respect to the second preferred peak 210 of the second differential curve 204 as depicted in the predefined distribution graph 200. Based on the lateral shift in the first peak 304, the controller 106 may determine the type of depletion of the NCM material as the ORI depletion. The controller 106 may determine that the NCM material has been depleted due to the ORI depletion within a range of the SOC of the battery 102, i.e., approximately equals to 0.2 SOC-0.6 SOC. Further, the controller 106 may determine the rate of depletion of the NCM material with respect to the SOC of the battery 102 and the voltage of the battery 102.

Further, the controller 106 may determine a downward shift in the third peak 308 associated with the LMO material of the blended electrode within the active region of the LMO materials, during the operation of the battery 102. In particular, the controller 106 may determine the downward shift in the third peak 308 of the differential curve of the real-time distribution graph 300, based on the comparison with respect to the fourth preferred peak 214 of the third differential curve 206 as depicted in the predefined distribution graph 200. Based on the downward shift in the third peak 308, the controller 106 may determine the type of depletion of the LMO material as one of the LLI depletion and the LAM depletion. The controller 106 may determine that the LMO material depletes due to one of the LLI depletion and the LAM depletion within a range of the SOC of the battery 102, i.e., approximately equals to 0.6 SOC-1.0 SOC. Further, the controller 106 may determine the rate of depletion of the LMO material with respect to the SOC of the battery 102 and the voltage of the battery 102.

Figure 5:
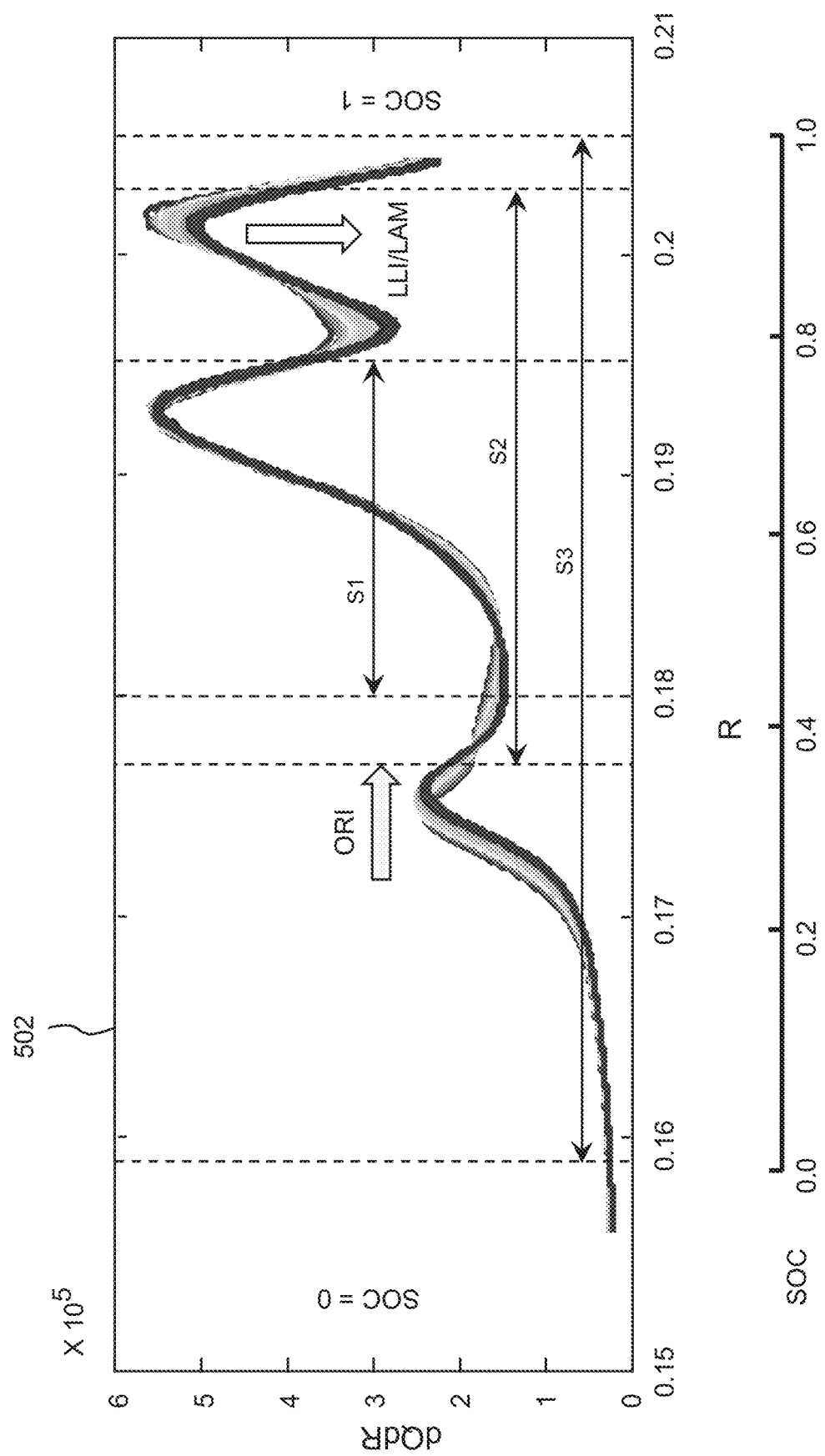
FIG. 5 illustrates a graph depicting an example of at least one of a range of a State-of-Charge (SOC), a range of a voltage, and a range of a current to operate a battery for enhanced service life, in accordance with one or more embodiments.

FIG. 5 illustrates an example of a graphical plot depicting at least one of a range of a State-of-Charge (SOC), a range of a voltage, and a range of a current to operate the battery 102 for enhanced service life, in accordance with one or more embodiments. As discussed earlier, upon determining the type of depletion and the rate of depletion, the controller 106 may determine at least one of the range of the SOC, the range of the voltage, and the range of current to operate the battery 102 for enhanced service life.

For instance, as shown in FIG. 5, the controller 106 may determine a first range 51 of the SOC between approximately 0.18 mΩ-0.195 mΩ (or 0.4 SOC-0.7 SOC) of the battery 102. The first range 51 of the SOC may indicate a minimum amount of degradation of the active materials and a minimum loss of resistance of the battery 102. In view of the minimum amount of degradation and low resistance loss, the controller 106 may identify the first range 51 of the SOC as an optimal range of the SOC for operation of the battery 102. In an example, if the battery 102 is operated within the first range 51 of the SOC, overall life of the battery 102 may be enhanced due to the minimum amount of degradation of the active materials of the blended electrode and low resistance of the battery 102.

In an example, the controller 106 may determine a second range S2 of the SOC between approximately 0.175 mΩ-0.203 mΩ of the battery 102. Referring to FIG. 5, graph 502 depicts that the LMO material may degrade due to one of the LLI depletion and the LAM depletion within the second range S2 of the SOC. For instance, if the battery 102 is operated within the second range S2 of the SOC, the active material, i.e., the LMO material may degrade due to one of the LLI depletion and the LAM depletion, thereby reducing overall life of the battery 102.

Furthermore, the controller 106 may determine a third range S3 of the SOC within a range of approximately 0.157 mΩ-0.205 mΩ of the battery 102. Referring to FIG. 5, the graph 502 depicts that the NCM material is degraded due to the ORI depletion within the third range S3 of the SOC. Further, the graph also depicts that the LMO material is degraded due to one of the LLI depletion and the LAM depletion within the third range S3 of the SOC. For example, if the battery 102 is operated within the third range S3 of the SOC, the active materials, i.e., the LMO material and the NCM material may degrade due to the ORI depletion and the LLI/LLAMA depletion, thereby reducing the overall life of the battery 102.

On the basis of the determination of the range of the SOC, the range of the voltage, and the range of the current, the controller 106 may generate the notification for the user to operate the battery 102 within the range of the SOC, the range of the current, or the range of the voltage. As discussed earlier, the controller 106 may also generate the performance report which may include information indicative of at least one of the range of the SOC, the range of the current, and the range of the voltage for charging and consumption of the battery 102.

Figure 6:
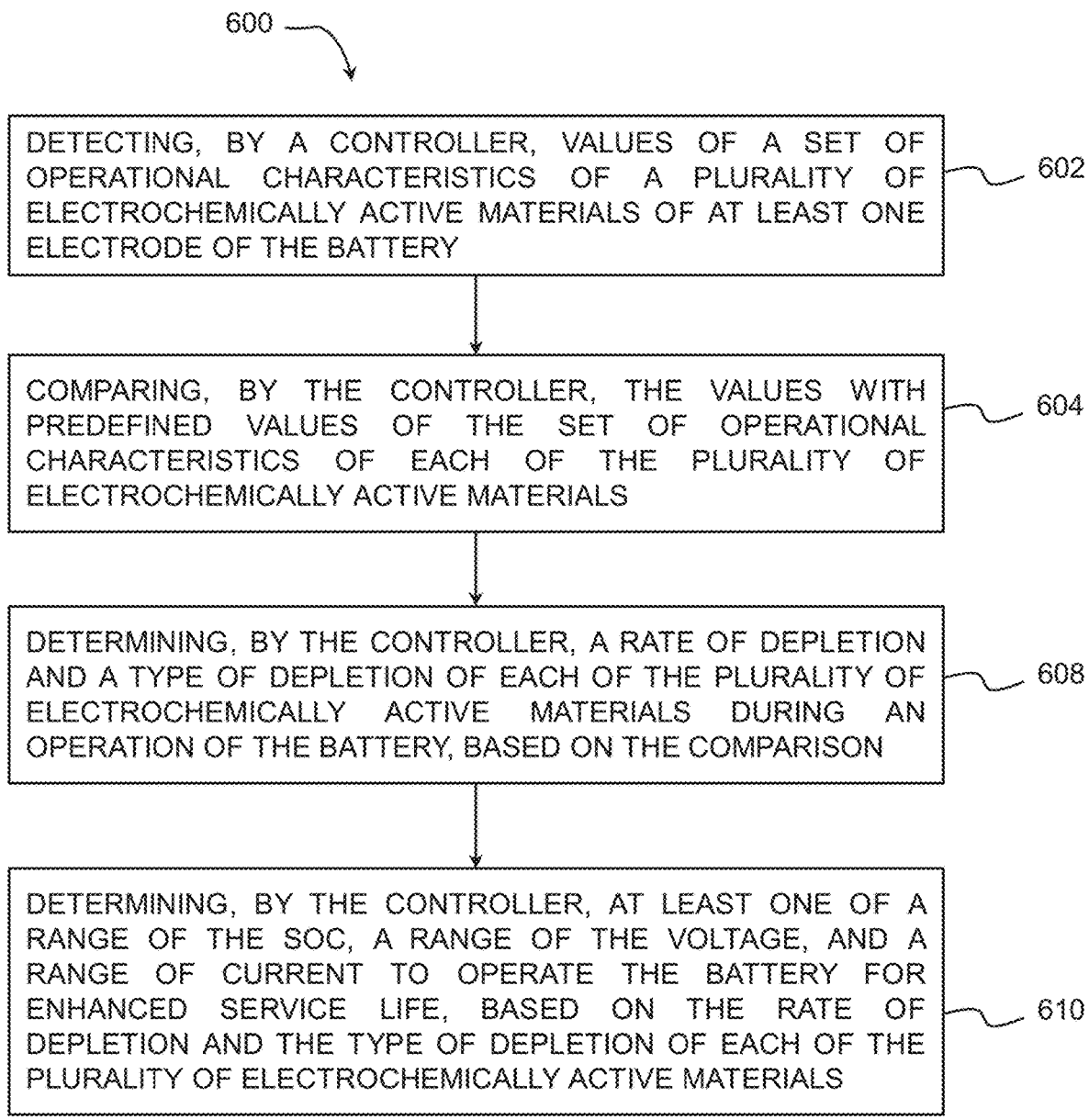
FIG. 6 illustrates a flowchart depicting an example of a method for enhancing a service life of a battery, in accordance with one or more embodiments.

FIG. 6 illustrates a flowchart depicting a method 600 for enhancing the service life of the battery 102, in accordance with one or more embodiments. The operations in FIG. 6 may be performed in the sequence and manner as shown, although the order of some operations may be changed or some of the operations omitted without departing from the spirit and scope of the illustrative examples described. Many of the operations shown in FIG. 6 may be performed in parallel or concurrently. One or more blocks of FIG. 6, and combinations of the blocks, can be implemented by special purpose hardware-based computer that perform the specified functions, or combinations of special purpose hardware and computer instructions. In addition to the description of FIG. 6 below, the descriptions of FIGS. 1-5 are also applicable to FIG. 6, and are incorporated herein by reference. Thus, the above description may not be repeated here.

In an example, the method 600 may be executed by the controller 106 of the system 100.

At operation 602, controller may detect, in real-time or during the operation of the battery 102, the values of the set of operational characteristics of the active materials of the electrode of the battery 102. In an example, the set of operational characteristics is indicative of at least one of the voltage (V), the change in accumulated energy (dQ), the change in ohmic resistance (dR), and the change in rate of change in accumulated energy with respect to the rate of change in the ohmic resistance (dQ/dR). At operation 604, the controller may compare the values of the set of operational characteristics of the active materials of the electrode of the battery 102 with predefined values of the set of operational characteristics of each of the active materials. In an example, the controller 106 may be configured to compare the values of the set of operational characteristics of the active materials of the electrode of the battery 102, with the predefined values of the set of operational characteristics of each of the active materials.

At operation 606, the controller may determine the rate of depletion and the type of depletion of each of the active materials during the operation of the battery 102, based on the comparison. The rate of depletion may be determined with respect to the State-of-Charge (SOC) and the voltage (V) of the battery 102. In an example, the controller may determine the type of depletion of each of the active materials as the ORI depletion, when the value of the change in the ohmic resistance (dR) increases with respect to the first predefined value. In an example, the controller may determine the type of depletion of each of the active materials as the LLI, when the value of the change in the ohmic resistance (dR) increases with respect to the second predefined value.

In an example, the controller may determine the type of depletion of each of the active materials as one of the LAM and the LLI, when at least one peak corresponding to the active materials in the first graph shifts downwardly with respect to the at least one predefined peak corresponding to each of the active materials in the second graph. As discussed earlier, the first graph may be associated with the detected values of the set of operation characteristics. The second graph may be associated with the predefined values of the set of operational characteristics.

At block 608, the controller may determine at least one of the range of the SOC, the range of the voltage, and the range of the current to operate the battery 102 for enhanced service life, based on the rate of depletion and the type of depletion of each of the active materials.

In an example, the controller may generate, based on at least one of the range of the current, and the range of the voltage, the notification for the user to operate the battery 102 within the range of the SOC and the range of the voltage. The notification may be at least one of a visual notification and an audio notification.

In an example, the controller may generate a performance report. The performance report may include, as non-limiting examples, at least one of: (a) the rate of depletion of each of the active materials of the blended electrode, (b) the type of depletion of each of the active materials of the of the blended electrode, and (c) information relating to at least one of the range of the SOC and the range of the voltage for charging and consumption of the battery 102. Additionally, the controller may receive the instruction indicating a selection of at least one of the range of the SOC, the range of the current, and the range of the voltage, in response to the generation of the performance report. The battery 102 may then be operated in one or more of the selected range of the SOC, the selected range of the current, and the selected range of the voltage, based on the received instruction.

The examples provide a method 600 and a system 100 that enhances the service life of the battery 102. As discussed earlier, the system 100 may be implemented on-board with the battery 102 that enhances the service life of the battery 102. The system 100 may determine variation in the values of the set of operational characteristics of each of the active materials of the blended electrode, in real-time or during the operation of the battery 102. Subsequently, the system 100 may determine the type of depletion and the rate of depletion of each of the active materials of the blended electrode of the battery 102. Therefore, the system 100 may eliminate the need for expensive off-line calculations that determine the type of depletion and the rate of depletion of each of the active materials of the blended electrode of the battery 102. For example, the system 100 may eliminate the need to solve a set of partial differential equations to determine the values of the set of operational characteristics of each of the active materials of the blended electrode at various SOC levels of the battery 102.

Additionally, the system 100 may provide the notifications and the performance report for the user to operate the battery 102 within one or more of the range of the SOC, the range of the current, and the range of the voltage, which may be determined based on the variation in the values of the set of operational characteristics of each of the active materials, in real-time or during the operation of the battery 102. Therefore, the examples may provide a method 600 and a system 100 that are efficient, economical, flexible, and effective in enhancing the service life of the battery 102.

The system 100, controller 106, processor 108, memory 110, components 112, data receiver 116, data comparator 118, depletion determinator 120, notification generator 122, report generator 124, battery 102, user interface 104, and other apparatuses, devices, units, modules, and components described herein with respect to FIGS. 1-6 are implemented as, and by, hardware components. Examples of further hardware components that may be used to perform the operations described in this application where appropriate include controllers, sensors, generators, drivers, memories, comparators, arithmetic logic units, adders, subtractors, multipliers, dividers, integrators, and any other electronic components configured to perform the operations described in this application. In other examples, one or more of the hardware components that perform the operations described in this application are implemented by computing hardware, for example, by one or more processors or computers. A processor or computer may be implemented by one or more processing elements, such as an array of logic gates, a controller and an arithmetic logic unit, a digital signal processor, a microcomputer, a programmable logic controller, a field-programmable gate array, a programmable logic array, a microprocessor, or any other device or combination of devices that is configured to respond to and execute instructions in a defined manner to achieve a desired result. In one example, a processor or computer includes, or is connected to, one or more memories storing instructions or software that are executed by the processor or computer. Hardware components implemented by a processor or computer may execute instructions or software, such as an operating system (OS) and one or more software applications that run on the OS, to perform the operations described in this application. The hardware components may also access, manipulate, process, create, and store data in response to execution of the instructions or software. For simplicity, the singular term "processor" or "computer" may be used in the description of the examples described in this application, but in other examples multiple processors or computers may be used, or a processor or computer may include multiple processing elements, or multiple types of processing elements, or both. For example, a single hardware component or two or more hardware components may be implemented by a single processor, or two or more processors, or a processor and a controller. One or more hardware components may be implemented by one or more processors, or a processor and a controller, and one or more other hardware components may be implemented by one or more other processors, or another processor and another controller. One or more processors, or a processor and a controller, may implement a single hardware component, or two or more hardware components. A hardware component may have any one or more of different processing configurations, examples of which include a single processor, independent processors, parallel processors, single-instruction single-data (SISD) multiprocessing, single-instruction multiple-data (SIM D) multiprocessing, multiple-instruction single-data (MISD) multiprocessing, and multiple-instruction multiple-data (MIMD) multiprocessing.

The methods illustrated in FIGS. 1-6 that perform the operations described in this application are performed by computing hardware, for example, by one or more processors or computers, implemented as described above executing instructions or software to perform the operations described in this application that are performed by the methods. For example, a single operation or two or more operations may be performed by a single processor, or two or more processors, or a processor and a controller. One or more operations may be performed by one or more processors, or a processor and a controller, and one or more other operations may be performed by one or more other processors, or another processor and another controller. One or more processors, or a processor and a controller, may perform a single operation, or two or more operations.

Instructions or software to control one or more processors or computers to implement the hardware components and perform the methods as described above may be written as computer programs, code segments, instructions or any combination thereof, for individually or collectively instructing or configuring the one or more processors or computers to operate as a machine or special-purpose computer to perform the operations performed by the hardware components and the methods as described above. In one example, the instructions or software include machine code that is directly executed by the one or more processors or computers, such as machine code produced by a compiler. In another example, the instructions or software include higher-level code that are executed by the one or more processors or computers using an interpreter. The instructions or software may be written using any programming language based on the block diagrams and the flow charts illustrated in the drawings and the corresponding descriptions in the specification, which disclose algorithms for performing the operations that are performed by the hardware components and the methods as described above.

The instructions or software to control computing hardware, for example, one or more processors or computers, to implement the hardware components and perform the methods as described above, and any associated data, data files, and data structures, may be recorded, stored, or fixed in or on one or more non-transitory computer-readable storage media. Examples of a non-transitory computer-readable storage medium include read-only memory (ROM), random-access programmable read only memory (PROM), electrically erasable programmable read-only memory (EEPROM), random-access memory (RAM), dynamic random access memory (DRAM), static random access memory (SRAM), flash memory, non-volatile memory, CD-ROMs, CD-Rs, CD+Rs, CD-RWs, CD+RWs, DVD-ROMs, DVD-Rs, DVD+Rs, DVD-RWs, DVD+RWs, DVD-RAMs, BD-ROMs, BD-Rs, BD-R LTHs, BD-REs, blue-ray or optical disk storage, hard disk drive (HDD), solid state drive (SSD), flash memory, a card type memory such as multimedia card micro or a card (for example, secure digital (SD) or extreme digital (XD)), magnetic tapes, floppy disks, magneto-optical data storage devices, optical data storage devices, hard disks, solid-state disks, and any other device that is configured to store the instructions or software and any associated data, data files, and data structures in a non-transitory manner and provide the instructions or software and any associated data, data files, and data structures to one or more processors or computers so that the one or more processors or computers can execute the instructions. In one example, the instructions or software and any associated data, data files, and data structures are distributed over network-coupled computer systems so that the instructions and software and any associated data, data files, and data structures are stored, accessed, and executed in a distributed fashion by the one or more processors or computers.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A method comprising:
   detecting, by a User Equipment (UE), values of a set of operational characteristics of a plurality of electrochemically active materials of at least one electrode of a battery;
   comparing, by the UE, the detected values with predefined values of the set of operational characteristics of each of the plurality of electrochemically active materials;
   determining, by the UE, a rate of depletion of each of the plurality of electrochemically active materials, and a type of depletion of each of the plurality of electrochemically active materials during an operation of the battery, based on the comparing, wherein the rate of depletion is determined based on at least one of a State-of-Charge (SOC) of the battery, and a voltage of the battery; and
   determining, by the UE, at least one of a range of the SOC, a range of the voltage, and a range of current to operate the battery, based on the determined rate of depletion and the determined type of depletion of each of the plurality of electrochemically active materials,
   wherein the determining of the type of depletion further includes:
   determining the type of depletion of each of the plurality of electrochemically active materials to be a first depletion type, when a value of a change in ohmic resistance increases with respect to a first predefined value; and
   determining the type of depletion of each of the plurality of electrochemically active materials to be a second different depletion type, when the value of the change in ohmic resistance increases with respect to a second predefined value.

2. The method of claim 1, wherein the set of operational characteristics comprises at least one of a voltage, a change in accumulated energy, a change in ohmic resistance, and a change in a rate of change in accumulated energy with respect to a rate of change in ohmic resistance.

3. The method of claim 1, further comprising:
   generating a notification to operate the battery within the determined range of the SOC, the determined range of the current, or the determined range of the voltage based on at least one of the determined range of the SOC, the determined range of the current, and the determined range of the voltage,
   wherein the notification is at least one of a visual notification and an audio notification.

4. The method of claim 1, further comprising:
   generating a performance report;
   receiving, in response to the generated performance report, an instruction to select at least one of the range of the SOC and the range of the voltage; and
   operating the battery in one of the selected range of the SOC and the selected range of the voltage, based on the received instruction,
   wherein the performance report comprises at least one of:
   (a) the rate of depletion of each of the plurality of electrochemically active materials of the at least one electrode;
   (b) the type of depletion of each of the plurality of electrochemically active materials of the at least one electrode; and
   (c) at least one of the range of the SOC, the range of the current, and the range of the charging voltage of the battery.

5. The method of claim 1, wherein the type of depletion comprises at least one of an Ohmic Resistance Increase (ORI) depletion, a Loss of Active Material (LAM) depletion, and a Loss of Lithium Inventory (LLI) depletion.

6. The method of claim 5, further comprising:
   determining the type of depletion of each of the plurality of electrochemically active materials to be the ORI depletion as the first depletion type, when the value of the change in ohmic resistance increases with respect to the first predefined value; and determining the type of depletion of each of the plurality of electrochemically active materials to be the LLI depletion as the second depletion type, when the value of the change in ohmic resistance increases with respect to the second predefined value.

7. The method of claim 5, further comprising:
determining the type of depletion of each of the plurality of electrochemically active materials to be one of the LAM and the LLI, when at least one peak corresponding to each of the plurality of electrochemically active materials in a first graph shifts downwardly with respect to at least one predefined peak corresponding to each of the plurality of electrochemically active materials in a second graph,
wherein the first graph depicts the detected values of the set of operational characteristics, and the second graph depicts the predefined values of the set of operational characteristics.

8. The method of claim 1, wherein the plurality of electrochemically active materials include a Lithium Manganese Oxide (LMO), Lithium Nickel Cobalt Aluminum Oxide (NCA), and Lithium Nickel Manganese Cobalt Oxide (NCM).

9. A system comprising:
a controller communicatively coupled with a battery, wherein the controller is configured to:
detect values of a set of operational characteristics of a plurality of electrochemically active materials of at least one electrode of the battery;
compare the detected values with predefined values of the set of operational characteristics of each of the plurality of electrochemically active materials;
determine a rate of depletion of each of the plurality of electrochemically active materials, and a type of depletion of each of the plurality of electrochemically active materials during an operation of the battery, based on the comparing, wherein the rate of depletion is determined based on at least one of a State-of-Charge (SOC) of the battery, and a voltage of the battery; and
determine at least one of a range of the SOC, a range of the voltage, and a range of current to operate the battery, based on the determined rate of depletion and the determined type of depletion of each of the plurality of electrochemically active materials,
wherein the determining of the type of depletion further includes:
determining the type of depletion of each of the plurality of electrochemically active materials to be a first depletion type, when a value of a change in ohmic resistance increases with respect to a first predefined value; and
determining the type of depletion of each of the plurality of electrochemically active materials to be a second different depletion type, when the value of the change in ohmic resistance increases with respect to a second predefined value.

10. The system of claim 9, wherein the set of operational characteristics comprises at least one of a voltage, a change in accumulated energy, a change in ohmic resistance, and a change in a rate of change in accumulated energy with respect to a rate of change in ohmic resistance.

11. The system of claim 9, wherein the controller is further configured to:
generate a notification to operate the battery within the determined range of the SOC, the determined range of the current, or the determined range of the voltage based on at least one of the determined range of SOC, the determined range of the current, and the determined range of the voltage,
wherein the notification is at least one of a visual notification and an audio notification.

12. The system of claim 9, wherein the controller is further configured to:
generate a performance report,
receive, in response to the generated performance report, an instruction to select at least one of the range of the SOC and the range of the voltage; and
operate the battery in one of the selected range of the SOC and the selected range of the voltage, based on the received instruction,
wherein the performance report comprises at least one of:
(a) the rate of depletion of each of the plurality of electrochemically active materials of the at least one electrode;
(b) the type of depletion of each of the plurality of electrochemically active materials of the at least one electrode; and
(c) at least one of the range of the SOC, the range of the current, and the range of the charging voltage of the battery.

13. The system of claim 9, wherein the type of depletion comprises at least one of Ohmic Resistance Increase (ORI) depletion, Loss of Active Material (LAM) depletion, and a Loss of Lithium Inventory (LLI) depletion.

14. The system of claim 13, wherein the controller is further configured to:
determine the type of depletion of each of the plurality of electrochemically active materials to be the ORI depletion as the first depletion type, when the value of the change in ohmic resistance increases with respect to the first predefined value; and
determine the type of depletion of each of the plurality of electrochemically active materials to be the LLI depletion as the second depletion type, when the value of the change in ohmic resistance increases with respect to the second predefined value.

15. The system of claim 13, wherein the controller is further configured to:
determine the type of depletion of each of the plurality of electrochemically active materials to be one of the LAM and the LLI, when at least one peak corresponding to at least one the plurality of electrochemically active materials in a first graph shifts downwardly with respect to at least one predefined peak corresponding to at least one of the plurality of electrochemically active materials in a second graph,
wherein the first graph depicts the detected values of the set of operational characteristics, and the second graph depicts the predefined values of the set of operational characteristics.

16. The system of claim 9, wherein the plurality of electrochemically active materials include a Lithium Manganese Oxide (LMO), Lithium Nickel Cobalt Aluminium Oxide (NCA), and Lithium Nickel Manganese Cobalt Oxide (NCM).

* * * * *